United States Patent
Miyake et al.

(10) Patent No.: US 10,520,814 B2
(45) Date of Patent: Dec. 31, 2019

(54) RESIST UNDERLAYER FILM-FORMING COMPOSITION, RESIST UNDERLAYER FILM, RESIST UNDERLAYER FILM-FORMING PROCESS, AND PRODUCTION METHOD OF PATTERNED SUBSTRATE

(71) Applicant: JSR CORPORATION, Tokyo (JP)

(72) Inventors: Masayuki Miyake, Tokyo (JP); Goji Wakamatsu, Tokyo (JP); Tsubasa Abe, Tokyo (JP); Kazunori Takanashi, Tokyo (JP); Kazunori Sakai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/672,660

(22) Filed: Aug. 9, 2017

(65) Prior Publication Data

US 2018/0046081 A1 Feb. 15, 2018

(30) Foreign Application Priority Data

Aug. 10, 2016 (JP) .................. 2016-158185

(51) Int. Cl.

| G03F 7/09 | (2006.01) |
|---|---|
| G03F 7/40 | (2006.01) |
| G03F 7/38 | (2006.01) |
| C08G 8/20 | (2006.01) |
| G03F 7/004 | (2006.01) |
| G03F 7/11 | (2006.01) |
| H01L 21/02 | (2006.01) |
| H01L 21/027 | (2006.01) |
| H01L 21/033 | (2006.01) |
| H01L 21/768 | (2006.01) |
| C09D 161/06 | (2006.01) |
| C09D 161/12 | (2006.01) |
| C09D 161/14 | (2006.01) |

(52) U.S. Cl.
CPC ............... *G03F 7/094* (2013.01); *C08G 8/20* (2013.01); *C09D 161/06* (2013.01); *C09D 161/12* (2013.01); *C09D 161/14* (2013.01); *G03F 7/0048* (2013.01); *G03F 7/11* (2013.01); *G03F 7/38* (2013.01); *G03F 7/40* (2013.01); *H01L 21/0271* (2013.01); *H01L 21/0273* (2013.01); *H01L 21/02118* (2013.01); *H01L 21/0332* (2013.01); *H01L 21/76886* (2013.01)

(58) Field of Classification Search
CPC .......... G03F 7/094; G03F 7/0048; G03F 7/11; G03F 7/38; G03F 7/40; C08G 8/20; C09D 161/14; C09D 161/12; C09D 161/06; H01L 21/0271; H01L 21/0332; H01L 21/02118; H01L 21/0273; H01L 21/76886

See application file for complete search history.

(56) References Cited

U.S. PATENT DOCUMENTS

| 2005/0074695 | A1 | 4/2005 | Nakamura et al. | |
|---|---|---|---|---|
| 2009/0214960 | A1* | 8/2009 | Takeda | G03F 7/0048 430/5 |
| 2012/0183908 | A1* | 7/2012 | Anno | G03F 7/0397 430/325 |
| 2013/0108965 | A1* | 5/2013 | Miyake | C08F 12/24 430/286.1 |
| 2013/0183830 | A1* | 7/2013 | Takeda | H01L 21/0332 438/703 |
| 2013/0233825 | A1* | 9/2013 | Kurita | G03F 7/094 216/41 |
| 2016/0009945 | A1* | 1/2016 | Enomoto | C08F 299/02 257/618 |
| 2017/0183531 | A1* | 6/2017 | Kori | C09D 155/00 |
| 2017/0184968 | A1* | 6/2017 | Kori | C07C 43/215 |

FOREIGN PATENT DOCUMENTS

| JP | 2004-177668 A | 6/2004 | |
|---|---|---|---|
| WO | WO-2014157228 A1 * | 10/2014 | ............ C08F 299/02 |

* cited by examiner

Primary Examiner — Cynthia Hamilton
(74) Attorney, Agent, or Firm — Oblon, McClelland, Maier & Neustadt, L.L.P.

(57) ABSTRACT

A resist underlayer film-forming composition includes a solvent, and a compound comprising an aromatic ring. The solvent includes a first solvent having a normal boiling point of less than 156° C., and a second solvent having a normal boiling point of no less than 156° C. and less than 300° C. The resist underlayer film-forming composition is for use in forming a resist underlayer film to be overlaid on a patterned substrate. A production method of a patterned substrate includes applying the resist underlayer film-forming composition on a patterned substrate to obtain a coating film on the patterned substrate. The coating film is heated to obtain a resist underlayer film. A resist pattern is formed on an upper face side of the resist underlayer film. The resist underlayer film and the substrate are etched using the resist pattern as a mask.

13 Claims, No Drawings

RESIST UNDERLAYER FILM-FORMING COMPOSITION, RESIST UNDERLAYER FILM, RESIST UNDERLAYER FILM-FORMING PROCESS, AND PRODUCTION METHOD OF PATTERNED SUBSTRATE

CROSS-REFERENCE TO RELATED APPLICATIONS

The present application claims priority to Japanese Patent Application No. 2016-158185, filed Aug. 10, 2016. The content of this application is incorporated herein by reference in their entirety.

BACKGROUND OF THE INVENTION

Field of the Invention

The present invention relates to a resist underlayer film-forming composition, a resist underlayer film, a resist underlayer film-forming process and a production method of a patterned substrate.

Discussion of the Background

In recent years, in the aim of increasing the degree of integration in a semiconductor wiring structure, it is becoming common to form a pattern on a substrate having a plurality of types of trench patterns (wiring grooves), particularly trench patterns having aspect ratios that differ from each other. In such a case, a resist underlayer film-forming composition for a semiconductor is required to be capable of forming a resist underlayer film that has trenches sufficiently embedded thereinto, and is superior in solvent resistance and flatness.

To meet these demands, structures of polymers, etc., contained in the resist underlayer film-forming composition for a semiconductor, and functional groups included in the polymers have been variously investigated (see Japanese Unexamined Patent Application, Publication No. 2004-177668).

SUMMARY OF THE INVENTION

According to an aspect of the present invention, a resist underlayer film-forming composition includes a solvent, and a compound comprising an aromatic ring. The solvent includes a first solvent having a normal boiling point of less than 156° C., and a second solvent having a normal boiling point of no less than 156° C. and less than 300° C. The resist underlayer film-forming composition is for use in forming a resist underlayer film to be overlaid on a patterned substrate.

According to another aspect of the present invention, a resist underlayer film formed from the resist underlayer film-forming composition.

According to further aspect of the present invention, a resist underlayer film-forming process includes applying the resist underlayer film-forming composition on a patterned substrate to obtain a coating film on the patterned substrate. The coating film is heated.

According to further aspect of the present invention, a production method of a patterned substrate includes applying the resist underlayer film-forming composition on a patterned substrate to obtain a coating film on the patterned substrate. The coating film is heated to obtain a resist underlayer film. A resist pattern is formed on an upper face side of the resist underlayer film. The resist underlayer film and the substrate are etched using the resist pattern as a mask.

DESCRIPTION OF THE EMBODIMENTS

According to an embodiment of the invention, a resist underlayer film-forming composition for a semiconductor, the composition being for use in forming a resist underlayer film to be overlaid on a patterned substrate, comprises: a solvent (hereinafter, may be also referred to as "solvent (A)"); and a compound comprising an aromatic ring (hereinafter, may be also referred to as "compound (B)"), wherein the solvent (A) comprises: a first solvent having a normal boiling point of less than 156° C.; and a second solvent having a normal boiling point of no less than 156° C. and less than 300° C.

According to another embodiment of the invention, a resist underlayer film formed from the resist underlayer film-forming composition is provided.

According to still another embodiment of the invention, a resist underlayer film-forming process comprises: applying the resist underlayer film-forming composition on a patterned substrate; and heating a coating film obtained by the applying.

According to yet another embodiment of the invention, a production method of a patterned substrate comprises: carrying out the resist underlayer film-forming process; a forming step of a resist pattern on an upper face side of the resist underlayer film obtained by the resist underlayer film-forming process; and an etching step with the resist pattern as a mask.

The term "normal boiling point" as referred to means a boiling point at one atmospheric pressure.

Effects of the Invention

The resist underlayer film-forming composition for a semiconductor according to the embodiment of the present invention is capable of forming a resist underlayer film that is superior in flatness, embedding properties, solvent resistance and also the defects-inhibiting property after etching, i.e., the property of being capable of reducing defects caused due to residues, etc. remaining after etching of the formed resist underlayer film. The resist underlayer film according to the embodiment of the present invention is to superior in flatness, the embedding properties, solvent resistance, and also the defects-inhibiting property after etching. The resist underlayer film-forming process according to the embodiment of the present invention is capable of conveniently forming a resist underlayer film superior in flatness, the embedding properties, solvent resistance and also the defects-inhibiting property after etching. The production method of a patterned substrate according to the embodiment of the present invention is capable of obtaining a substrate having a superior pattern configuration. Therefore, these can be suitably used in production of semiconductor devices and the like, in which further progress of miniaturization is expected in the future. Hereinafter, embodiments of the present invention will be described in detail. It is to be noted that the present invention is not limited to the following embodiments.

Resist Underlayer Film-Forming Composition for Semiconductor

A resist underlayer film-forming composition for a semiconductor (hereinafter, may be also referred to as "resist underlayer film-forming composition") provided herein relates to a resist underlayer film-forming composition for forming a resist underlayer film overlaid on a patterned substrate, and the composition contains a solvent (A) and a compound (B). The resist underlayer film-forming composition may contain, as a favorable component, an acid generating agent (C) and/or a crosslinking agent (D), and may also contain other optional component within a range not leading to impairment of the effects of the present invention. Hereinafter, each component will be explained.
Solvent (A)

The solvent (A) dissolves or disperses the compound (B) and an optional component contained as needed. The solvent (A) contains a first solvent (hereinafter, may be also referred to as solvent (A1)) having the normal boiling point of less than 156° C. and a second solvent (hereinafter, may be also referred to as solvent (A2)) having the normal boiling point of no less than 156° C. and less than 300° C. By virtue of containing the solvent (A) and the compound (B), the resist underlayer film-forming composition is capable of forming a is resist underlayer film superior in flatness, the embedding properties, solvent resistance, and also the defects-inhibiting property after etching. Although the reason for achieving the above described effects owing to the resist underlayer film-forming composition having the aforementioned constitution is not necessarily clear, and without wishing to be bound by any theory, for example, the reason may be inferred as follows. When the resist underlayer film-forming composition contains the solvent (A1) and the solvent (A2), high-molecular weight polymers, etc. in the compound (B) are homogeneously dispersed in the resist underlayer film formed by applying the resist underlayer film-forming composition on the substrate. As a result, defects caused due to the residue, etc. after etching of the resist underlayer film are believed to be reduced. The solvent (A) may contain other solvent than the solvent (A1) and the solvent (A2) within a range not leading to impairment of the effects of the present invention. Each of the solvent (A1), the solvent (A2), and the other solvent may be used either alone or in combination of two or more types thereof. Hereinafter, each component is explained in detail.
Solvent (A1)

The solvent (A1) has the normal boiling point of less than 156° C.

The upper limit of the normal boiling point of the solvent (A1) is preferably 155° C. and more preferably 147° C. When the normal boiling point of the solvent (A1) is no greater than the upper limit, the solubility of the compound (B) can be improved.

The lower limit of the normal boiling point of the solvent (A1) is preferably 100° C. and more preferably 120° C. When the normal boiling point of the solvent (A1) is no less than the lower limit, the solubility of the compound (B), acid generating agent (C), and crosslinking agent (D) can be improved, and the storage stability of the resist underlayer film-forming composition can also be improved.

Examples of the solvent (A1) (temperature (° C.) in parentheses showing the normal boiling point value) include:

monohydric alcohols such as methanol (65° C.), ethanol (78° C.), n-propanol (97° C.), iso-propanol (82° C.), n-butanol (117° C.), iso-butanol (108° C.), sec-butanol (99° C.), tert-butanol (82° C.), n-pentanol (138° C.), iso-pentanol (132° C.), 2-methylbutanol (136° C.), sec-pentanol (118° C.), tert-pentanol (102° C.), 2-methylpentanol (148° C.) and 2-ethylbutanol (146° C.);

carboxylic acid esters, e.g., propionic acid esters such as iso-butyl propionate (138° C.), as well as lactic acid esters such as ethyl lactate (151° C.), and the like;

alkylene glycol monoalkyl ethers such as ethylene glycol monomethyl ether (125° C.), ethylene glycol monoethyl ether (135° C.), propylene glycol monomethyl ether (121° C.), propylene glycol monoethyl ether (133° C.) propylene glycol monopropyl ether (149.8° C.); and alkylene glycol monoalkyl ether acetates such as ethylene glycol monomethyl ether acetate (145° C.) and propylene glycol monomethyl ether acetate (146° C.).

Of these, in light of enabling the solubility of the compound (B) to be further improved, the solvent (A1) is preferably an alkylene glycol monoalkyl ether, an alkylene glycol monoalkyl ether acetate, or a combination thereof, more preferably a propylene glycol monoalkyl ether acetate, and still more preferably propylene glycol monomethyl ether acetate.

The lower limit of the percentage content of the solvent (A1) in the solvent (A) is preferably 20% by mass, more preferably 30% by mass, still more preferably 40% by mass, particularly preferably 60% by mass, and still particularly preferably 75% by mass. The upper limit of the percentage content is preferably 99.9% by mass, more preferably 99% by mass, still more preferably 98% by mass, particularly preferably 95% by mass, and still particularly preferably 90% by mass. When the percentage content of the solvent (A1) falls within the above range, further improvements of the embedding properties, solvent resistance and the defects-inhibiting property after etching of the resist underlayer film are enabled.
Solvent (A2)

The solvent (A2) has the normal boiling point of no less than 156° C. and less than 300° C. When the solvent (A) contains the solvent (A2) as a high boiling point component, the evaporation of the solvent upon heating of a coating film is inhibited, and the fluidity of a constitutive component of the coating film containing the solvent (A) is enhanced, thereby consequently enabling the flatness of the resist underlayer film to be improved.

The lower limit of the normal boiling point of the solvent (A2) is preferably 170° C., more preferably 180° C., still more preferably 200° C., and particularly preferably 210° C. When the normal boiling point of the solvent (A2) is no less than the lower limit, the flatness of the resist underlayer film can be improved effectively.

The upper limit of the normal boiling point of the solvent (A2) is preferably 250° C., more preferably 240° C., and particularly preferably 230° C. When the normal boiling point of the solvent (A2) is no greater than the upper limit, a residue of the solvent after forming the resist underlayer film can be reduced, and the solvent resistance can be further improved.

A component of the solvent (A2) is exemplified by an ester, an alcohol, an ether, a carbonate, a ketone, an amide solvent, and the like. The temperature (° C.) in parentheses for each solvent exemplified below shows the normal boiling point value.

Examples of the Ester Include carboxylic acid esters, e.g.; acetic acid esters such as 2-ethylbutyl acetate (160° C.), 2-ethylhexyl acetate (199° C.), benzyl acetate (212° C.), cyclohexyl acetate (172° C.), methylcyclohexyl acetate (201° C.) and n-nonyl acetate (208° C.); acetoacetic acid esters such as methyl acetoacetate (169° C.) and ethyl acetoacetate (181° C.); propionic acid esters such as iso-amyl propionate (156° C.); oxalic acid esters such as diethyl oxalate (185° C.) and di-n-butyl oxalate (239° C.); lactic acid esters such as n-butyl lactate (185° C.); malonic acid esters such as diethyl malonate (199° C.); phthalic acid esters such as dimethyl phthalate (283° C.); lactones such as β-propiolactone (162° C.), γ-butyrolactone (204° C.), γ-valerolactone (207° C.) and γ-undecalactone (286° C.); 1,6-diacetoxy hexane (260° C.); alkylene glycol diacetates such as 1,3-butylene glycol diacetate (232° C.); and the like.

Examples of the Alcohol Include:

monohydric alcohols such as 3-methoxybutanol (157° C.), n-hexanol (157° C.), n-octanol (194° C.), sec-octanol (174° C.), n-nonyl alcohol (215° C.), n-decanol (228° C.), phenol (182° C.), cyclohexanol (161° C.) and benzyl alcohol (205° C.);

polyhydric alcohols such as ethylene glycol (197° C.), 1,2-propylene glycol (188° C.), 1,3-butylene glycol (208° C.), 2,4-pentanediol (201° C.), 2-methyl-2,4-pentanediol (196° C.), 2,5-hexanediol (216° C.), triethylene glycol (165° C.), dipropylene glycol (230° C.) and glycerin (290° C.); and polyhydric alcohol partial ethers such as ethylene glycol monobutyl ether (171° C.), ethylene glycol monophenyl ether (244° C.), diethylene glycol monomethyl ether (194° C.), diethylene glycol monoethyl ether (202° C.), triethylene glycol monomethyl ether (249° C.), diethylene glycol monoisopropyl ether (207° C.), diethylene glycol monobutyl ether (231° C.), triethylene glycol monobutyl ether (271° C.), ethylene glycol monoisobutyl ether (161° C.), diethylene glycol monoisobutyl ether (220° C.), ethylene glycol monohexyl ether (208° C.), diethylene glycol monohexyl ether (259° C.), ethylene glycol mono 2-ethylhexyl ether (229° C.), diethylene glycol mono 2-ethylhexyl ether (272° C.), ethylene glycol monoallyl ether (159° C.), diethylene glycol monophenyl ether (283° C.), ethylene glycol monobenzyl ether (256° C.), diethylene glycol monobenzyl ether (302° C.), dipropylene glycol monomethyl ether (187° C.), tripropylene glycol monomethyl ether (242° C.), dipropylene glycol monopropyl ether (212° C.), propylene glycol monobutyl ether (170° C.), dipropylene glycol monobutyl ether (231° C.) and propylene glycol monophenyl ether (243° C.).

Examples of the Ether Include:

dialkylene glycol monoalkyl ether acetates such as dipropylene glycol monomethyl ether acetate (213° C.), diethylene glycol monoethyl ether acetate (217° C.) and diethylene glycol monobutyl ether acetate (247° C.);

alkylene glycol monoalkyl ether acetates such as butylene glycol monomethyl ether acetate (172° C.) and ethylene glycol monobutyl ether acetate (188° C.);

dialkylene glycol dialkyl ethers such as diethylene glycol dimethyl ether (162° C.), diethylene glycol methylethyl ether (176° C.), diethylene glycol diethyl ether (189° C.), diethylene glycol dibutyl ether (255° C.) and dipropylene glycol dimethyl ether (171° C.);

trialkylene glycol dialkyl ethers such as triethylene glycol dimethyl ether (216° C.);

tetraalkylene glycol dialkyl ethers such as tetraethylene glycol dimethyl ether (275° C.);

dihydrocarbon group ethers such as diisopentyl ether (171° C.), anisole (155° C.), ethylbenzyl ether (189° C.), diphenyl ether (259° C.), dibenzyl ether (297° C.) and dihexyl ether (226° C.); and cyclic ethers such as 1,8-cineol (176° C.).

Examples of the carbonate include ethylene carbonate (244° C.), propylene carbonate (242° C.), and the like.

Examples of the ketone include ethyl amyl ketone (167° C.), dibutyl ketone (186° C.), diamyl ketone (228° C.), and the like.

Examples of the amide solvent include N-methylpyrrolidone (204° C.), N,N-dimethylacetamide (165° C.), formamide (210° C.), N-ethylacetamide (206° C.), N-methylacetamide (206° C.), and the like.

Examples of the solvent (A2) further include furfural (162° C.), dimethyl sulfoxide (189° C.), sulfolane (287° C.), succinonitrile (265° C.), nitrobenzene to (211° C.), and the like.

Of these, the ester, the alcohol, the ether, the carbonate or a combination thereof is preferred, the carboxylic acid esters, the monohydric alcohols, the polyhydric alcohols, the polyhydric alcohol partial ethers, the dialkylene glycol monoalkyl ether acetates and the dialkylene glycol dialkyl ethers are more preferred, γ-butyrolactone, benzyl alcohol, dipropylene glycol dimethyl ether, dipropylene glycol monomethyl ether, dipropylene glycol monobutyl ether, tripropylene glycol monomethyl ether, dipropylene glycol monomethyl ether acetate, diethylene glycol monoethyl ether acetate, diethylene glycol monobutyl ether acetate and propylene carbonate are still more preferred, and dipropylene glycol monomethyl ether acetate and diethylene glycol monoethyl ether acetate are particularly preferred.

When the solvent (A2) is selected from the aforementioned solvents, improvements of the embedding properties and solvent resistance of the resist underlayer film are enabled.

The lower limit of the value of the relative evaporation rate of the solvent (A2) is, provided that the evaporation rate of butyl acetate is 100, preferably 0.01, more preferably 0.05, and still more preferably 0.1. When the value of the relative evaporation rate of the solvent (A2) is no less than the lower limit, the residue of the solvent after forming the resist underlayer film can be reduced.

Furthermore, the upper limit of the value of the relative evaporation rate of the solvent (A2) is, provided that the evaporation rate of butyl acetate is 100, preferably 10, more preferably 8, still more preferably 6, and particularly preferably 4. When the relative evaporation rate of the solvent (A2) is no greater than the upper limit, the evaporation of the solvent upon heating of a coating film is inhibited and consequently the fluidity of a constitutive component of the coating film containing the solvent (A) is further enhanced, thereby enabling the flatness of the coating film to be further improved.

It is to be noted that "relative evaporation rate" as referred to means a value of an evaporation rate measured according to ASTM-D3539 under conditions involving a temperature of 25° C. and an atmospheric pressure of 1 atm.

Examples of the solvent (A2) having a value of the relative evaporation rate in the aforementioned range (the numeral value in parentheses for each solvent showing a value of the relative evaporation rate, provided that the value for butyl acetate is 100) include propylene glycol monopropyl ether (21), propylene glycol monobutyl ether (7), dipropylene glycol monomethyl ether acetate (1.5), diethylene glycol monoethyl ether acetate (1), diethylene glycol monobutyl ether acetate (less than 1), dipropylene glycol monomethyl ether (3), dipropylene glycol monobutyl ether (1), tripropylene glycol monomethyl ether (less than 1), γ-butyrolactone (less than 1), and the like.

The viscosity of the solvent (A2) is preferably no less than 0.8 mPa·s and no greater than 10.0 mPa·s. When the viscosity of the solvent (A2) falls within the above range, the fluidity of the constitutive component of the coating film containing the solvent (A) upon heating of the coating film is enhanced, thereby enabling the flatness thereof to be further improved.

It is to be noted that "viscosity" as referred to means the degree of resistance to flow of a liquid (fluid) as a substance, and may be also referred to as a "coefficient of viscosity". As for the viscosity, values measured at 25° C. listed in "Solvent Handbook" and the like can be referred to. The viscosity of solvents that are not listed in the Solvent Handbook shall be values measured at 25° C. according to JIS-Z8803: 2011.

The lower limit of the viscosity of the solvent (A2) is preferably 1.0 mPa·s and more preferably 1.5 mPa·s.

Furthermore, the upper limit of the viscosity of the solvent (A2) is preferably 8.0 mPa·s, more preferably 6.0 mPa·s, still more preferably 5.0 mPa·s, and particularly preferably 3.5 mPa·s. When the viscosity of the solvent (A2) falls within the above range, the fluidity of the solvent (A) is further enhanced, thereby enabling the flatness thereof to be further improved.

Examples of the solvent (A2) having the viscosity in the aforementioned range (the numeral value in parentheses for each solvent showing a value of the viscosity at 25° C.) include dipropylene glycol monomethyl ether acetate (1.7 mPa·s), diethylene glycol monoethyl ether acetate (2.5 mPa·s), diethylene glycol monobutyl ether acetate (3.1 mPa·s), dipropylene glycol dimethyl ether (1.0 mPa·s), dipropylene glycol monomethyl ether (3.6 mPa·s), dipropylene glycol monobutyl ether (4.5 mPa·s), tripropylene glycol monomethyl ether (5.3 mPa·s), γ-butyrolactone (1.8 mPa·s), propylene carbonate (2.3 mPa·s), tetraethylene glycol dimethyl ether (3.8 mPa·s), 1,6-diacetoxy hexane (3.9 mPa·s), dipropylene glycol (20 mPa·s), 1,3-butylene glycol diacetate (2.9 mPa·s), and the like.

The percentage content of the solvent (A2) in the solvent (A) is preferably no less than 0.1% by mass and less than 60% by mass. The lower limit of the percentage content is more preferably 1% by mass, still more preferably 2% by mass, particularly preferably 5% by mass, and still particularly preferably 10% by mass. When the percentage content of the solvent (A2) is no less than the lower limit, a further improvement in the flatness is enabled. Furthermore, the upper limit of the percentage content is more preferably 50% by mass, still more preferably 45% by mass, particularly preferably 40% by mass, and still particularly preferably 25% by mass. When the percentage content of the solvent (A2) is no greater than the upper limit, a further improvement in the solvent resistance is enabled.

Compound (B)

The compound (B) has an aromatic ring other than those of the solvent (A). The compound (B) is not particularly limited so long as it has an aromatic ring. The compound (B) may be used either alone of one type, or in combination of two or more types thereof.

Examples of the Aromatic Ring Include:

aromatic carbon rings such as a benzene ring, naphthalene ring, anthracene ring, indene ring, pyrene ring, fluorenylidene biphenyl ring and fluorenylidene binaphthalene ring; and heteroaromatic rings such as a furan ring, pyrrole ring, thiophene ring, phosphole ring, pyrazole ring, oxazole ring, isoxazole ring, thiazole ring, pyridine ring, pyrazine ring, pyrimidine ring, pyridazine ring and triazine ring; and the like. Of these, the aromatic carbon rings are preferred.

The compound (B) is exemplified by: a resin having an aromatic ring in a main chain, and a resin having an aromatic ring in a side chain without having an aromatic ring in a main chain; an aromatic ring-containing compound having a molecular weight of no less than 300 and no greater than 3,000, and the like.

The "resin" as referred to herein means a compound containing two or more structural units. The "aromatic ring-containing compound" as referred to means a compound containing one structural unit. The "main chain" as referred to means the longest chain among chains constituted by atoms in the resin. The "side chain" as referred to means chains other than the longest chain among the chains constituted by atoms in the resin.

The resin is exemplified by a polycondensation compound, a compound obtained by a reaction other than the polycondensation, and the like.

Exemplary resins include a novolak resin, resol resin, styrene resin, acenaphthylene resin, indene resin, arylene resin, triazine resin, calixarene resin, fullerene resin, and the like.

Novolak Resin

The novolak resin is obtained by reacting a phenolic compound with an aldehyde, a divinyl compound or the like, by using an acidic catalyst. The reaction may be permitted through mixing a plurality of phenolic compounds with the aldehyde, the divinyl compound or the like.

Examples of the phenolic compound include: phenols such as phenol, cresol, xylenol, resorcinol, bisphenol A, p-tert-butylphenol, p-octylphenol, 9,9-bis(4-hydroxyphenyl)fluorene and 9,9-bis(3-hydroxyphenyl)fluorene; naphthols such as α-naphthol, β-naphthol, 1,5-dihydroxynaphthalene, 2,7-dihydroxynaphthalene and 9,9-bis(6-hydroxynaphthyl)fluorene; anthrols such as 9-anthrol; pyrenes such as 1-hydroxypyrene and 2-hydroxypyrene; and the like.

Examples of the aldehyde include: aldehydes such as formaldehyde, benzaldehyde, 1-naphthoaldehyde, 2-naphthoaldehyde and 1-formyl pyrene; aldehyde sources such as paraformaldehyde and trioxane; and the like.

Examples of the divinyl compounds include divinylbenzene, dicyclopentadiene, tetrahydroindene, 4-vinylcyclohexene, 5-vinylnorborn-2-ene, divinylpyrene, limonene, 5-vinylnorbornadiene, and the like.

The novolak resin is exemplified by: a resin having a structural unit derived from dihydroxynaphthalene and formaldehyde; a resin having a structural unit derived from fluorenebisphenol and formaldehyde; a resin having a structural unit derived from fluorenebisnaphthol and formaldehyde; a resin having a structural unit derived from hydroxypyrene and formaldehyde; a resin having a structural unit derived from a phenol compound and formyl pyrene; a resin obtained by substituting a part or all of hydrogen atoms of a phenolic hydroxyl group of these resins with a propargyl group or the like; and the like.

Resol Resin

The resol resin is obtained by reacting a phenolic compound with an aldehyde by using an alkaline catalyst.

Styrene Resin

The styrene resin has a structural unit derived from a compound containing an aromatic ring and a polymerizable carbon-carbon double bond. The styrene resin may have a structural unit derived from an acrylic monomer, a vinyl ether, etc., in addition to the aforementioned structural unit.

Examples of the styrene resin include polystyrene, polyvinylnaphthalene, polyhydroxystyrene, polyphenyl (meth)acrylate, a resin in combination of these, and the like.

Acenaphthylene Resin

The acenaphthylene resin has a structural unit derived from a compound containing an acenaphthylene skeleton.

The acenaphthylene resin is preferably a copolymer of acenaphthylene and hydroxymethyl acenaphthylene, in light of further improvements in the flatness and the embedding properties of the resist underlayer film.

Indene Resin

The indene resin has a structural unit derived from a compound containing an indene skeleton.

Arylene Resin

The arylene resin has a structural unit derived from a compound containing an arylene skeleton. Examples of the arylene skeleton include a phenylene skeleton, a naphthylene skeleton, a biphenylene skeleton, and the like.

Examples of the arylene resin include polyarylene ether, polyarylene sulfide, polyarylene ether sulfone, polyarylene ether ketone, a resin having a structural unit containing a biphenylene skeleton, a resin having a structural unit containing a biphenylene skeleton and a structural unit derived from a compound containing an acenaphthylene skeleton, and the like.

The arylene resin is preferably a resin having a biphenylene skeleton, and more preferably a resin having a structural unit containing a biphenylene skeleton and a structural unit derived from a compound containing an acenaphthylene skeleton, in light of the further improvement in the flatness, the embedding properties, and the defects-inhibiting property after etching of the resist underlayer film.

Triazine Resin

The triazine resin has a structural unit derived from a compound containing a triazine skeleton.

A compound containing a triazine skeleton is exemplified by a melamine compound, a cyanuric acid compound, and the like.

When the compound (B) is a novolak resin, a resol resin, a styrene resin, an acenaphthylene resin, an indene resin, an arylene resin or a triazine resin, the polystyrene equivalent weight average molecular weight (Mw) of the compound (B) as determined by gel permeation chromatography (GPC) is preferably greater than 2,000, more preferably no less than 3,000, and still more preferably no less than 5,000. Furthermore, the Mw is preferably no greater than 100,000, more preferably no greater than 50,000, and still more preferably no greater than 30,000.

The lower limit of the ratio Mw/Mn (wherein, Mn represents the polystyrene equivalent number average molecular weight as determined by GPC) of the compound (B) is typically 1 and preferably 1.1. The upper limit of the ratio Mw/Mn is preferably 5, more preferably 3, and still more preferably 2.

When the Mw and the ratio Mw/Mn of the compound (B) fall within the above ranges, the flatness and embedding properties of a resist underlayer film and the defects-inhibiting property after etching can be further improved.

Calixarene Resin

The calixarene resin is constituted from a cyclic oligomer having a plurality of aromatic rings with which a hydroxyl group is coupled in a cyclic manner via a hydrocarbon group, or a cyclic oligomer in which a part or all of hydrogen atoms contained in the hydroxy group, the aromatic rings and the hydrocarbon group is substituted.

Examples of the calixarene resin include: cyclic tetramers through dodecamers formed with a phenol compound such as phenol or naphthol, and formaldehyde; cyclic tetramers through dodecamers formed with a phenol compound such as phenol or naphthol, and a benzaldehyde compound; a resin in which a hydrogen atom of a phenolic hydroxyl group contained in these cyclic forms is substituted with a propargyl group or the like, and the like.

The lower limit of the molecular weight of the calixarene resin is preferably 500, more preferably 700, and still more preferably 1,000, in light of the further improvement of the flatness of the resist underlayer film. The upper limit of the molecular weight is preferably 5,000, more preferably 3,000, and still more preferably 1,500.

Aromatic Ring-Containing Compound having Molecular Weight of no less than 300 and no greater than 3,000

The aromatic ring-containing compound contains an aromatic ring and has a molecular weight of no less than 300 and no greater than 3,000. When the aromatic ring-containing compound is accompanied by a molecular weight distribution, the molecular weight of the aromatic ring-containing compound is a polystyrene equivalent weight average molecular weight (Mw) as determined by, for example, the gel permeation chromatography (GPC).

The aromatic ring-containing compound is exemplified by: a compound containing a fluorenebisphenol skeleton; a compound containing a spiroindene skeleton; a compound containing a truxene skeleton, a compound containing a triphenylbenzene skeleton, and the like.

The lower limit of the molecular weight of the aromatic ring-containing compound is preferably 350, more preferably 400, still more preferably 500, and particularly preferably 600. The upper limit of the molecular weight is preferably 2,500, more preferably 2,000, and still more preferably 1,500. When the molecular weight of the aromatic ring-containing compound falls within the above range, a further improvement of the flatness of a resist underlayer film is enabled.

The lower limit of the content of the compound (B) with respect to the sum (total solid content) of the components other than the solvent (A) of the resist underlayer film-forming composition is preferably 80% by mass, more preferably 85% by mass, still more preferably 90% by mass, and particularly preferably 95% by mass. The upper limit of the content of the compound (B) is, for example, 100% by mass. The compound (B) may be used either alone of one type, or in combination of two or more types thereof.

Synthesis Process of Compound (B)

The compound (B) may be synthesized according to a well-known process, or a commercially available product may be used as the compound (B).

Acid Generating Agent (C)

The acid generating agent (C) is a component that generates an acid by an action of heat and/or light and facilitates crosslinking of the compound (B). When the resist underlayer film-forming composition contains the acid generating agent (C), the crosslinking reaction of the compound (B) is facilitated, and an increase in the hardness of the formed resist underlayer is enabled. The acid generating agent (C) may be used either alone of one type, or in combination of two or more types thereof.

The acid generating agent (C) is exemplified by an onium salt compound, an N-sulfonyloxyimide compound, and the like.

Examples of the onium salt compound include: sulfonium salts such as triphenylsulfonium trifluoromethanesulfonate and triphenylsulfonium nonafluoro-n-butanesulfonate; tetrahydrothiophenium salts such as 1-(4-n-butoxynaphthalen-1-yl)tetrahydrothiophenium trifluoromethanesulfonate and 1-(4-n-butoxynaphthalen-1-yl)tetrahydrothiophenium nonafluoro-n-butanesulfonate; iodonium salts such as diphenyliodonium trifluoromethanesulfonate, diphenyliodonium nonafluoro-n-butanesulfonate, bis(4-t-butylphenyl)iodonium trifluoromethanesulfonate and bis(4-t-butylphenyl)iodonium nonafluoro-n-butanesulfonate; ammonium salts such as triethylammonium nonafluoro-n-butanesulfonate and triethylammonium 1,1,3,3,3-pentafluoro-2-(pivaloyloxy)propanesulfonate; and the like.

Examples of the N-sulfonyloxyimide compound include N-(trifluoromethanesulfonyloxy)bicyclo[2.2.1]hept-5-ene- 2,3-dicarboxyimide, N-(nonafluoro-n-butanesulfonyloxy)bicyclo[2.2.1]hept-5-ene-2,3-dicarboxyimide, and the like.

Of these, the acid generating agent (C) is preferably an onium salt compound, more preferably an iodonium salt and an ammonium salt, and still more preferably bis(4-t-butylphenyl)iodonium nonafluoro-n-butanesulfonate and triethylammonium nonafluoro-n-butanesulfonate.

When the resist underlayer film-forming composition contains the acid generating agent (C), the lower limit of the content of the acid generating agent (C) with respect to 100 parts by mass of the compound (B) is preferably 0.1 parts by mass, more preferably 0.5 parts by mass, and still more preferably 1 part by mass. The upper limit of the content is preferably 20 parts by mass, more preferably 15 parts by mass, and still more preferably 10 parts by mass. When the content of the acid generating agent (C) falls within the above range, more effective promotion of the crosslinking reaction of the compound (B) is enabled.

Crosslinking Agent (D)

The crosslinking agent (D) is a component that forms a crosslinking bond between molecules of the component such as the compound (B) by an action of heat and/or an acid. Even in the case in which the compound (B) contains an intermolecular bond-forming group, when the resist underlayer film-forming composition further contains the crosslinking agent (D), a further increase in the hardness of the resist underlayer film is enabled. The crosslinking agent (D) can be used either alone of one type, or in combination of two or more types thereof.

Examples of the crosslinking agent (D) include: polyfunctional (meth)acrylate compounds such as trimethylolpropane tri(meth)acrylate and pentaerythritol tri(meth)acrylate; epoxy compounds such as novolac-type epoxy resins and bisphenol epoxy resins; hydroxymethyl group-substituted phenol compounds such as 2-hydroxymethyl-4,6-dimethyl phenol, 4,4'-(1-(4-(1-(4-hydroxy-3,5-bis(methoxymethyl)phenyl)-1-methylethyl)phenyl)ethylidene)bis(2,6-bis(methoxymethyl)phenol); alkoxyalkyl group-containing phenol compounds such as methoxymethyl group-containing phenol compounds and ethoxymethyl group-containing phenol compounds; compounds having an alkoxyalkylated amino group such as (poly)methylolated melamines and (poly)methylolated glycolurils; and the like.

Of these, the crosslinking agent (D) is preferably a methoxymethyl group-containing phenol compound and a compound having an alkoxyalkylated amino group, and more preferably 4,4'-(1-(4-(1-(4-hydroxy-3,5-bis(methoxymethyl)phenyl)-1-methylethyl)phenyl)ethylidene)bis(2,6-bis(methoxymethyl)phenol) and 1,3,4,6-tetra(methoxymethyl)glycoluril.

When the resist underlayer film-forming composition contains the crosslinking agent (D), the lower limit of the content of the crosslinking agent (D) with respect to 100 parts by mass of the compound (B) is preferably 0.1 parts by mass, more preferably 0.5 parts by mass, still more preferably 1 part by mass, and particularly preferably 3 parts by mass. The upper limit of the content is preferably 100 parts by mass, more preferably 50 parts by mass, still more preferably 30 parts by mass, and particularly preferably 20 parts by mass. When the content of the crosslinking agent (D) falls within the above range, the crosslinking reaction of the compound (B) may be allowed to cause more effectively.

Other Optional Component

As other optional component, the resist underlayer film-forming composition may contain, for example, (E) a polymeric additive (except for those corresponding to the compound (B) and the crosslinking agent (D)), an adhesion aids, etc.

(E) Polymeric Additive

When the resist underlayer film-forming composition contains the polymeric additive (E), the coating applicability on a substrate can be more enhanced. The polymeric additive (E) can be used either alone of one type, or in combination of two or more types thereof.

The polymeric additive (E) is exemplified by a (poly)oxyalkylene polymer compound, a fluorine-containing polymer compound, a non-fluorine polymer compound, and the like.

Examples of the (poly)oxyalkylene polymer compound include: polyoxyalkylenes such as (poly)oxyethylene-(poly)oxypropylene adducts; (poly)oxyalkyl ethers such as diethylene glycol heptyl ether, polyoxyethylene oleyl ether, polyoxypropylene butyl ether, polyoxyethylene polyoxypropylene-2-ethylhexyl ether, and an oxyethylene-oxypropylene adduct to a higher alcohol having 12 to 14 carbon atoms; (poly)oxyalkylene (alkyl)aryl ethers such as polyoxypropylene phenyl ether and polyoxyethylene nonylphenyl ether; acetylene ethers obtained by addition polymerization of an acetylene alcohol such as 2,4,7,9-tetramethyl-5-decyne-4,7-diol, 2,5-dimethyl-3-hexyne-2,5-diol or 3-methyl-1-butyne-3-ol with an alkylene oxide; (poly)oxyalkylene fatty acid esters such as a diethylene glycololeic acid ester, a diethylene glycollauryl acid ester, and an ethylene glycol distearic acid ester; (poly)oxyalkylene sorbitan fatty acid esters such as a polyoxyethylene sorbitan monolaurin acid ester and a polyoxyethylene sorbitan trioleic acid ester; (poly)oxyalkylene alkyl(aryl)ether sulfuric acid ester salts such as polyoxypropylene methyl ether sodium sulfate and polyoxyethylene dodecyl phenol ether sodium sulfate; (poly)oxyalkylene alkyl phosphoric acid esters such as a (poly)oxyethylene stearyl phosphoric acid ester; (poly)oxyalkylene alkylamines such as polyoxyethylene laurylamine, and the like.

When the resist underlayer film-forming composition contains the (poly)oxyalkylene polymer compound as the polymeric additive (E), the embedding properties can be further enhanced.

The fluorine-containing polymer compound is exemplified by a compound having a repeating unit derived from a (meth)acrylate compound containing a fluorine atom, and the like. Specific examples of the fluorine-containing polymer compound include compounds having one or two or more types of repeating units derived from a (meth)acrylate monomer containing a fluorine atom such as 2,2,2-trifluoroethyl (meth)acrylate, 2,2,3,3-tetrafluoropropyl (meth)acrylate, 1,1,1,3,3,3-hexafluoroisopropyl (meth)acrylate, 1,1,1,2,3,3,3-heptafluoroisopropyl (meth)acrylate, 2,2,3,3,4,4,5,5-octafluoropentyl (meth)acrylate, 3,3,4,4,5,5,6,6,7,7,8,8-tridecafluorooctyl (meth)acrylate, 2,2,3,3,4,4,5,5,6,6,7,7-dodecafluoroheptyl (meth)acrylate, 2,2,3,4,4,4-hexafluorobutyl (meth)acrylate, 1,2,2,2-tetrafluoro-1-(trifluoromethyl)ethyl (meth)acrylate, 2-(perfluorobutyl)ethyl (meth)acrylate or 2-(perfluorohexyl)ethyl (meth)acrylate, and the like.

When the resist underlayer film-forming composition contains the fluorine-containing polymer compound as the polymeric additive, further enhancement of the evenness in thickness of a coating film is enabled.

Examples of the non-fluorine polymer compound include: linear or branched alkyl (meth)acrylate such as lauryl (meth)acrylate, 2-ethylhexyl (meth)acrylate, n-butyl (meth)acrylate, t-butyl (meth)acrylate, isooctyl (meth)acrylate, isostearyl (meth)acrylate and isononyl (meth)acrylate; alkoxyethyl (meth)acrylate such as methoxyethyl (meth) acrylate; alkylene glycol di(meth)acrylate such as ethylene glycol di(meth)acrylate and 1,3-butylene glycol di(meth) acrylate; hydroxyalkyl (meth)acrylate such as 2-hydroxyethyl (meth)acrylate, 2-hydroxypropyl (meth)acrylate, 2-hydroxybutyl (meth)acrylate and 4-hydroxybutyl (meth) acrylate; compounds having one or two or more types of repeating units derived from a (meth)acrylate monomer such as dicyclopentenyloxyethyl (meth)acrylate and nonylphenoxy polyethylene glycol (having —$(CH_2CH_2O)_n$— structure, n=1 to 17) (meth)acrylate, and the like.

When the resist underlayer film-forming composition contains the non-fluorine polymer compound as the polymeric additive (E), further enhancement of the flatness thereof is enabled.

Examples of commercially available products of the polymeric additive include: "Newcol 2320", "Newcol 714-F", "Newcol 723", "Newcol 2307", "Newcol 2303" (each from NIPPON NYUKAZAI CO., LTD.), "PIONIN D-1107-S", "PIONIN D-1007", "PIONIN D-1106-DIR", "NEW KALGEN TG310", "NEW KALGEN TG310", "PIONIN D-6105-W", "PIONIN D-6112", "PIONIN D-6512" (each from TAKEMOTO OIL & FAT Co., Ltd.), "Surfinol 420", "Surfinol 440", "Surfinol 465", "Surfinol 2502" (each from Air Products and Chemicals, Inc.), "MegafaceF171", "MegafaceF172", "MegafaceF173", "MegafaceF176", "MegafaceF177", "MegafaceF141", "MegafaceF142", "MegafaceF143", "MegafaceF144", "MegafaceR30", "MegafaceF437", "MegafaceF475", "MegafaceF479", "MegafaceF482", "MegafaceF554", "MegafaceF780", "MegafaceR-40", "MegafaceDS-21", "MegafaceRS-56", "MegafaceRS-90", "MegafaceRS-72-K" (each from DIC Corporation), and the like.

When the resist underlayer film-forming composition contains the polymeric additive (E), the lower limit of the content of the polymeric additive (E) with respect to 100 parts by mass of the compound (B) is preferably 0.1 parts by mass, more preferably 0.5 parts by mass, and still more preferably 1 part by mass. The upper limit of the content is preferably 100 parts by mass, more preferably 50 parts by mass, and still more preferably 20 parts by mass.

Preparation Process of Resist Underlayer Film-Forming Composition for Semiconductor The resist underlayer film-forming composition may be prepared by mixing the solvent (A), the compound (B), and as needed, other optional component(s) such as the acid generating agent (C), the crosslinking agent (D) and/or the polymeric additive (E) in a predetermined ratio, preferably followed by filtering a resulting mixture through a membrane filter, etc. having a pore size of about 0.1 µm. The lower limit of the solid content concentration of the resist underlayer film-forming composition is preferably 0.1% by mass, more preferably 1% by mass, still more preferably 2% by mass, and particularly preferably 4% by mass. The upper limit of the solid content concentration is preferably 50% by mass, more preferably 30% by mass, still more preferably 20% by mass, and particularly preferably 10% by mass.

The solid content concentration of the resist underlayer film-forming composition as referred to means a value (% by mass) obtained by: baking the resist underlayer film-forming composition at 250° C. for 30 min; measuring the mass of the solid content in the resist underlayer film-forming composition; and dividing the mass of the solid content by the mass of the resist underlayer film-forming composition.

Resist Underlayer Film

The resist underlayer film according to the embodiment of the present invention is formed from the resist underlayer film-forming composition. Since the resist underlayer film is formed from the aforementioned resist underlayer film-forming composition, the resist underlayer film is superior in flatness, embedding properties, solvent resistance, and also the defects-inhibiting property after etching.

Resist Underlayer Film-Forming Process

The resist underlayer film-forming process includes steps of: applying the resist underlayer film-forming composition on a patterned substrate (hereinafter, may be also referred to as "applying step"); and heating a coating film obtained by the applying (hereinafter, may be also referred to as "heating step"). According to the resist underlayer film-forming process, since the aforementioned resist underlayer film-forming composition is used, formation of a resist underlayer film superior in flatness, the embedding properties, solvent resistance, and also the defects-inhibiting property after etching is enabled.

Applying Step

In this step, the resist underlayer film-forming composition is applied on the patterned substrate.

A pattern of the patterned substrate is exemplified by patterns having different aspect ratios. In regard to the shape, examples of the pattern include a trench pattern, a via pattern, and the like. The depth of the trench pattern is, for example, 1 µm, 0.5 µm, 0.1 µm, etc. The groove width of the trench pattern is, for example, 10 µm, 5 µm, 1 µm, 0.1 µm, 50 nm, 10 nm, etc. The depth of the via pattern is, for example, 1 µm, 0.5 µm, 0.1 µm, etc. The width of the via pattern is, for example, 500 nm, 100 nm, 50 nm, 20 nm, etc. Two or more patterns thereof may be combined.

The pattern is exemplified by those including silicon atoms or metal atoms. More specifically, the pattern is exemplified by those including a metal, a metal nitride, a metal oxide, a silicon oxide, or silicon.

Examples of the substrate include silicon wafers, wafers coated with aluminum, and the like. Furthermore, an application procedure of the resist underlayer film-forming composition is not particularly limited, and the resist underlayer film-forming composition may be applied in an appropriate procedure such as spin coating, flow casting coating, and roll coating, whereby the formation of the coating film is enabled.

Heating Step

In this step, the coating film obtained by the applying step is heated, whereby the resist underlayer film is formed.

Heating of the coating film is typically carried out in an ambient air or may be carried out under a nitrogen atmosphere. The heating may be carried out in a single-step manner or a multi-step manner. However, the heating is preferably carried out in two steps. In other words, a first heating and a second heating are preferably carried out.

The temperature of the first heating is preferably no less than 60° C. and no greater than 250° C. The lower limit of the time period of the first heating is preferably 10 sec, more preferably 30 sec, and still more preferably 60 sec. The upper limit of the time period is preferably 300 sec, more preferably 180 sec, still more preferably 120 sec. When the first heating is carried out to preliminarily evaporate a solvent and make the film dense, a subsequent hardening reaction taking place upon heating may efficiently proceed.

The lower limit of the temperature of the second heating is preferably 150° C., more preferably 200° C., and still more preferably 250° C. The upper limit of the temperature is preferably 500° C., more preferably 450° C., and still more preferably 400° C. When the temperature is less than 150° C., oxidative crosslinking may not proceed sufficiently, and characteristics required as the resist underlayer film may not be exhibited. The lower limit of the time period of the second heating is preferably 15 sec, more preferably 30 sec, and still more preferably 45 sec. The upper limit of the time period is preferably 600 sec, more preferably 300 sec, and still more preferably 180 sec.

It is to be noted that, in the resist underlayer film-forming process, the film is heated to form the resist underlayer film; however, in a case where the resist underlayer film-forming composition contains the acid generating agent (C) that is a radiation-sensitive acid generating agent, the resist underlayer film may also be formed by hardening the film through a combination of an exposure and heating. A radioactive ray used for the exposure may be appropriately selected from electromagnetic waves such as visible light rays, ultraviolet rays, far ultraviolet rays, X-rays, and γ-rays, particle beams such as electron beams, molecular beams, and ion beams, and the like, according to the type of the acid generating agent (C).

The lower limit of an average thickness of the resist underlayer film thus formed is preferably 50 nm, more preferably 100 nm, and still more preferably 200 nm. The upper limit of the average thickness is preferably 3,000 nm, more preferably 2,000 nm, and still more preferably 500 nm.

Production Method of Patterned Substrate

The production method of a patterned substrate according to the embodiment of the present invention involves: the resist underlayer film-forming process; a forming step of a resist pattern on an upper face side of the resist underlayer film obtained by the resist underlayer film-forming process (hereinafter, may be also referred to as "resist pattern-forming step"); and an etching step with the resist pattern as a mask (hereinafter, may be also referred to as "etching step").

According to the production method of a patterned substrate, due to using the resist underlayer film obtained by the resist underlayer film-forming process superior in flatness, the embedding properties, solvent resistance, and also the defects-inhibiting property after etching, the provision of a patterned substrate having a superior pattern configuration is enabled.

The production method of a patterned substrate may further involve, as a to multilayer resist process, a forming procedure of an intermediate layer (interlayer) on an upper face side of the resist underlayer film as needed before the resist pattern-forming step. In this context, the multilayer resist process refers to a process which includes procedures to provide the resist underlayer film, the intermediate layer, and the resist pattern. Each step, process or procedure will be described below.

Intermediate Layer Forming Procedure

In this procedure, the intermediate layer is formed on an upper face side of the resist underlayer film. The intermediate layer as referred to means a layer which may be provided in the resist pattern formation so as to further compensate for the function exhibited by the resist underlayer film and/or the resist film, or to impart a function not exhibited by the resist underlayer film and/or the resist film. For example, when an antireflective film is provided as the intermediate layer, further enhancement of an antireflecting function of the resist underlayer film is enabled.

The intermediate layer may be formed from an organic compound and/or an inorganic oxide. Examples of the organic compound include commercially available products such as: "DUV-42", "DUV-44", "ARC-28" and "ARC-29" (each manufactured by Brewer Science); "AR-3" and "AR-19" (each manufactured by Lohm and Haas Company); and the like. Examples of the inorganic oxide include commercially available products such as "NFC SOG01", "NFC SOG04" and "NFC SOG080" (each manufactured by JSR Corporation), and the like. Also, as the inorganic oxide, a polysiloxane, a titanium oxide, an alumina oxide, a tungsten oxide, or the like to be provided through a CVD process may be used.

The intermediate layer forming procedure is not particularly limited, and for example, a coating procedure, a CVD technique, or the like may be employed. Of these, a coating procedure is preferred. In a case where the coating procedure is employed, the intermediate layer may be successively provided after the resist underlayer film is provided. Moreover, the average thickness of the intermediate layer may be appropriately selected depending on the function required for the intermediate layer, and the lower limit of the average thickness of the intermediate layer is preferably 10 nm and more preferably 20 nm. The upper limit of the average thickness is preferably 3,000 nm and more preferably 300 nm.

Resist Pattern-Forming Step

In this step, a resist pattern is formed on an upper face side of the resist underlayer film. When the intermediate layer forming procedure has been carried out, the resist pattern is formed on an upper face side of the intermediate layer. This step may be carried out by, for example, using a resist composition.

When the resist composition is used, specifically, the resist film is formed by applying the resist composition such that a resulting resist film has a predetermined thickness and thereafter subjecting the resist composition to prebaking to evaporate the solvent in the coating film.

Examples of the resist composition include: a positive or negative chemically amplified resist composition that contains a radiation-sensitive acid generating agent; a positive type resist composition containing an alkali-soluble resin and a quinone diazide based photosensitizing agent; a negative type resist composition containing an alkali-soluble resin and a crosslinking agent; and the like.

The lower limit of the solid content concentration of the resist composition is preferably 0.3% by mass, and more preferably 1% by mass. The upper limit of the solid content concentration is preferably 50% by mass, and more preferably 30% by mass. In addition, the resist composition is typically provided to form a resist film, for example, after being filtered through a filter with a pore size of about 0.2 μm. It is to be noted that a commercially available resist composition may be used as is in this step.

The application procedure of the resist composition is not particularly limited, and examples thereof include a spin-coating procedure, and the like. In addition, the temperature of the prebaking may be appropriately adjusted depending on the type, etc., of the resist composition used, and the lower limit of the temperature is preferably 30° C., and more preferably 50° C. The upper limit of the temperature is preferably 200° C., and more preferably 150° C. The lower limit of prebaking time period is preferably 10 sec and more preferably 30 sec. The upper limit of the time period is preferably 600 sec and more preferably 300 sec.

Next, the formed resist film is exposed by selective irradiation with radioactive rays. The radioactive rays for use in the exposure may be appropriately selected from electromagnetic waves such as visible rays, ultraviolet rays, far ultraviolet rays, X-rays, and particle beams such as electron beams, γ radiations, molecular beams, ion beams, and the like, depending on the type of the photo acid generating agent used in the resist composition. Of these, far ultraviolet rays are preferred, and a KrF excimer laser beam (248 nm), an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm), extreme-ultraviolet rays (wavelength: 13.5 nm, etc., EUV) and the like are more preferred. The KrF excimer laser beam, the ArF excimer laser beam, and the EUV are still more preferred.

Post-baking may be carried out after the exposure for the purpose of improving a resolution, a pattern profile, developability, and the like. The temperature of the post-baking may be appropriately adjusted depending on the type of the resist composition used and the like, and the lower limit of the temperature is preferably 50° C., and more preferably 70° C. The upper limit of the temperature is preferably 200° C., and more preferably 150° C. The lower limit of the time period of the post-baking is preferably 10 sec, and more preferably 30 sec. The upper limit of the time period is preferably 600 sec, and more preferably 300 sec.

Next, the exposed resist film is developed with a developer solution to form a resist pattern. This development may be carried out with an alkali or with an organic solvent. In the case of a development with an alkali, examples of the developer solution include aqueous solutions of an alkali such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline or 1,8-diazabicyclo[5.4.0]-7-undecene, 1,5-diazabicyclo[4.3.0]-5-nonene. An appropriate amount of a water soluble organic solvent, e.g., an alcohol such as methanol and ethanol, a surfactant, and the like may be added to the alkaline aqueous solution. Alternatively, in the case of a development with an organic solvent, examples of the developer solution include a variety of organic solvents exemplified as the solvent (B) of the resist underlayer film-forming composition described above, and the like.

A predetermined resist pattern is formed by the development with the developer solution, followed by washing and drying.

In carrying out the resist pattern formation step, without using the resist composition as described above, other process may be employed, for example, a nanoimprint method may be adopted, or a directed self-assembling composition may be used.

Etching Step

In this step, etching is carried out with the aforementioned resist pattern as a mask to form a pattern on a substrate. The etching may be carried out once or multiple times. More specifically, the etching may be carried out sequentially with patterns obtained by the etching as masks. However, in light of obtaining a pattern with a favorable shape, the etching is preferably carried out multiple times. When the etching is carried out multiple times, in a case where the intermediate layer is not provided, the resist underlayer film and the substrate are subjected to etching sequentially in this order, whereas in a case where the intermediate layer is provided, the intermediate layer, the resist underlayer film and the substrate are subjected to etching sequentially in this order. The etching step may be exemplified by dry etching, wet etching, and the like. Of these, in light of achieving a pattern with a more favorable shape, dry etching is preferred. For example, gas plasma such as oxygen plasma and the like may be used as the dry etching. After the dry etching, the substrate having a predetermined pattern can be obtained.

EXAMPLES

Hereinafter, the embodiment of the present invention will be explained in more detail by way of Examples, but the present invention is not in any way limited to these Examples. Measuring methods for various types of physical properties are shown below.

Solid Content Concentration of Resist Underlayer Film-Forming Composition 0.5 g of the resist underlayer film-forming composition was baked at 250° C. for 30 min, followed by measuring the mass of the solid content in 0.5 g of the resist underlayer film-forming composition to calculate the solid content concentration (% by mass) of the resist underlayer film-forming composition.

Preparation of Resist Underlayer Film-Forming Composition for Semiconductor

The solvent (A), the compound (B), the acid generating agent (C), the crosslinking agent (D), and the polymeric additive (E) used in the preparation of the resist underlayer film-forming composition for a semiconductor are shown below.

Solvent (A)

Solvent (A1)

A-1: propyleneglycol monomethyl ether acetate (normal boiling point: 146° C.)

A-2: propyleneglycol monomethyl ether (normal boiling point: 121° C.)

Solvent (A2)

A-3: dipropyleneglycol monomethyl ether acetate (normal boiling point: 213° C.)

A-4: diethyleneglycol monoethyl ether acetate (normal boiling point: 217° C.)

A-5: diethyleneglycol monobutyl ether acetate (normal boiling point: 247° C.)

A-6: dipropyleneglycol dimethyl ether (normal boiling point: 171° C.)

A-7: dipropyleneglycol monomethyl ether (normal boiling point: 187° C.)

A-8: dipropyleneglycol monobutyl ether (normal boiling point: 231° C.)

A-9: tripropyleneglycol monomethyl ether (normal boiling point: 242° C.)

A-10: γ-butyrolactone (normal boiling point: 204° C.)

A-11: benzyl alcohol (normal boiling point: 205° C.)

A-12: propylene carbonate (normal boiling point: 242° C.)

A-13: tetraethylene glycoldimethyl ether (normal boiling point: 275° C.)

A-14: 1,6-diacetoxy hexane (normal boiling point: 260° C.)

A-15: dipropylene glycol (normal boiling point: 230° C.)

A-16: 1,3-butylene glycol diacetate (normal boiling point: 232° C.)

Compound (B)

B-1: the resin represented by the following formula (B-1)

B-2: the resin having the structural unit represented by the following formula (B-2)

B-3: the resin represented by the following formula (B-3)

B-4: the resin having the structural unit represented by the following formula (B-4)

B-5: the resin having the structural unit represented by the following formula (B-5)

B-6: the resin represented by the following formula (B-6)

B-7: the resin represented by the following formula (B-7)

B-8: the resin represented by the following formula (B-8)

B-9: the resin represented by the following formula (B-9)

B-10: the resin represented by the following formula (B-10)

B-11: the resin having the structural unit represented by the following formula (B-11)

B-12: the resin represented by the following formula (B-12)

B-13: the resin represented by the following formula (B-13)

B-14: the resin having the structural unit represented by the following formula (B-14)

B-15: the resin having the structural unit represented by the following formula (B-15)

B-16: the resin represented by the following formula (B-16)

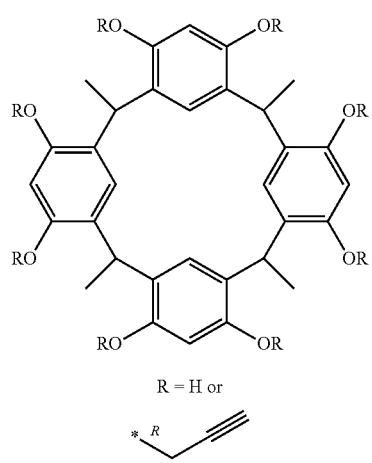
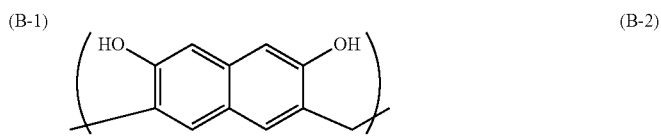
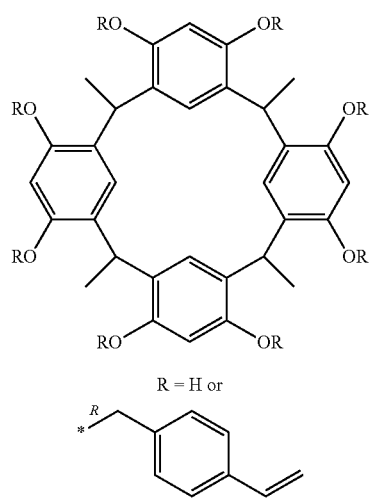
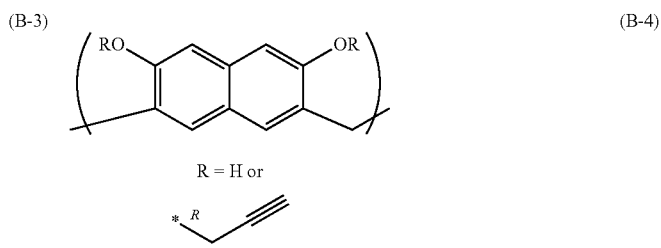
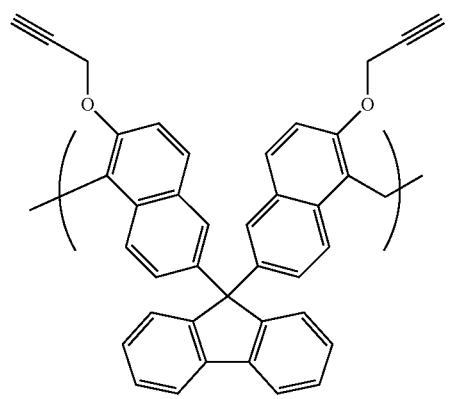
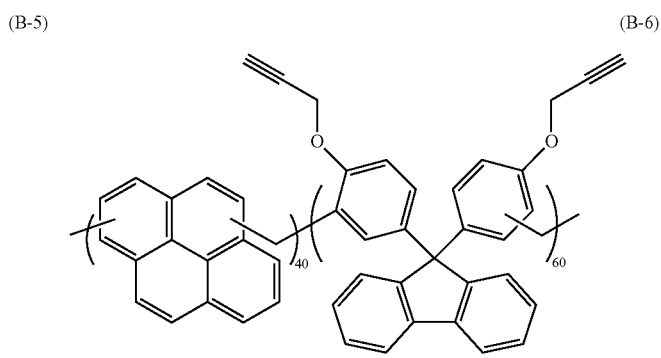

-continued
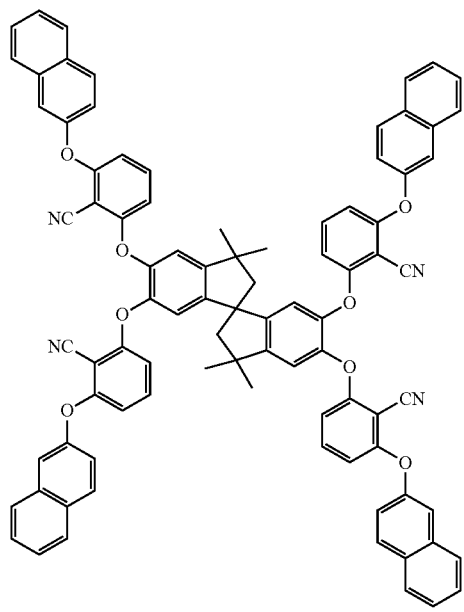
(B-7)
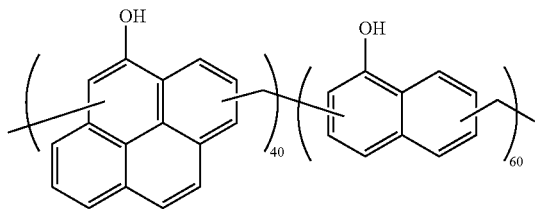
(B-8)
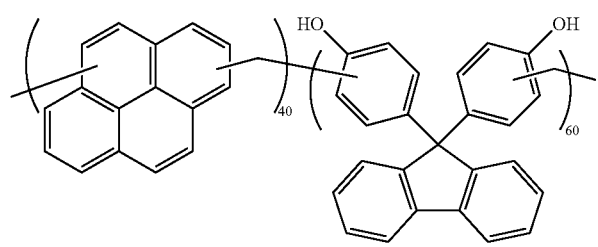
(B-9)
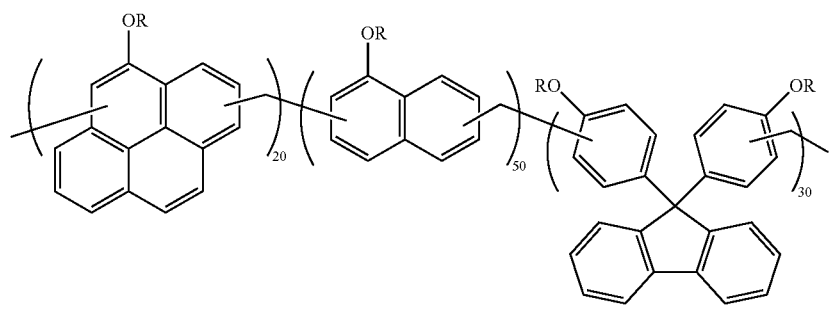
(B-10)
R = H or 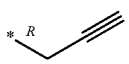
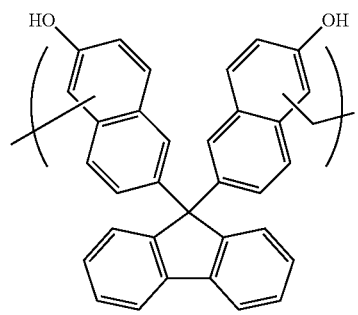
(B-11)
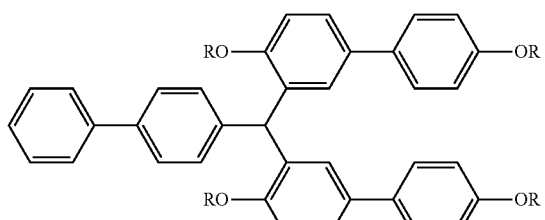
(B-12)
R = H or 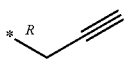

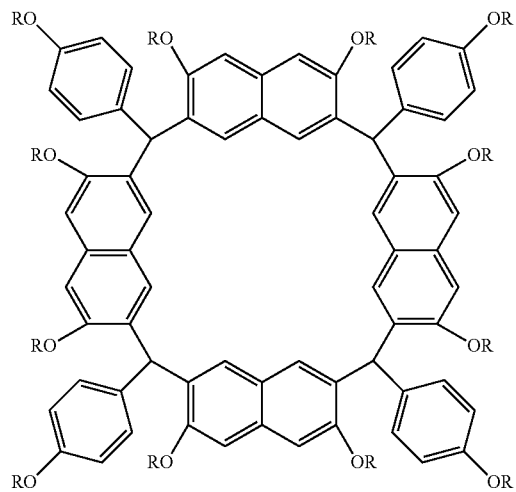
(B-13)

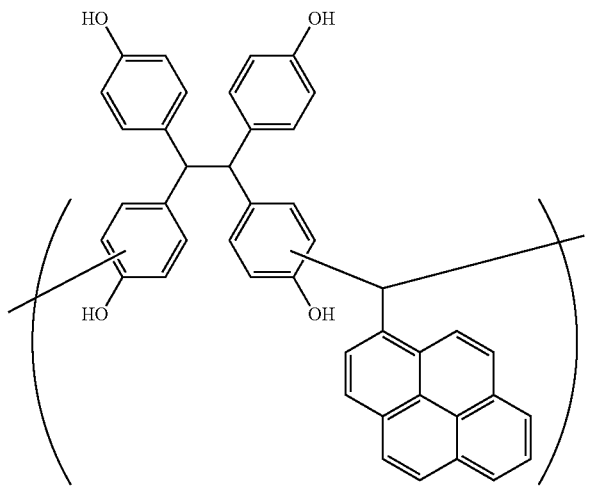
(B-14)

R = H or
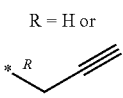

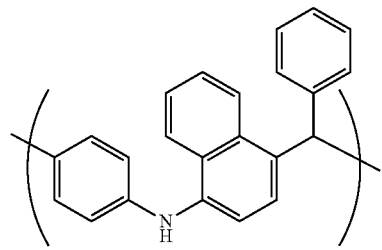
(B-15)

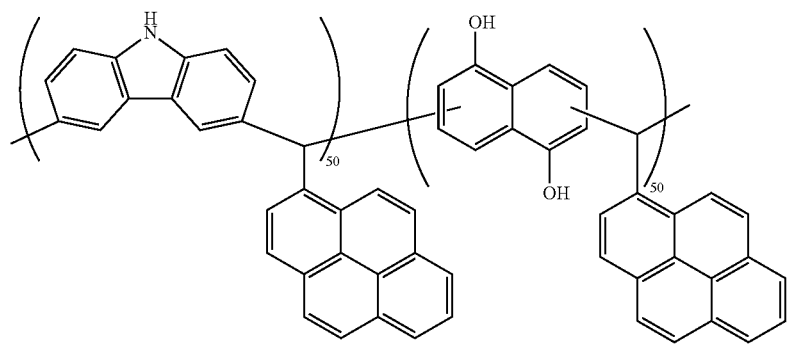
(B-16)

In the above formulae (B-1), (B-3), (B-4), (B-10), (B-12) and (B-13), *^R denotes a binding site to an oxygen atom.

In the above formulae (B-6), (B-8), (B-9), (B-10) and (B-16), the numeral given to each structural unit denotes the proportion of the structural unit (mol %).

Acid Generating Agent (C)

C-1: bis(4-t-butylphenyl)iodonium nonafluoro-n-butane-sulfonate (the to compound represented by the following formula (C-1))

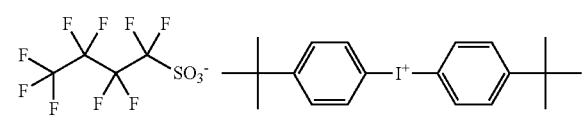
(C-1)

Crosslinking Agent (D)

D-1: 1,3,4,6-tetrakis(methoxymethyl)glycoluril (the compound represented by the following formula (D-1))

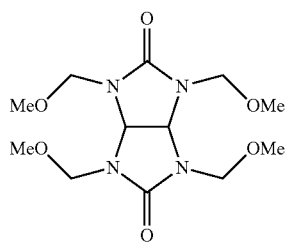

(D-1)

Polymeric Additive (E)
E-1: PIONIN D-6512 (TAKEMOTO OIL & FAT Co., Ltd.)
E-2: MegafaceR-40 (DIC Corporation)
E-3: MegafaceDS-21 (DIC Corporation)
E-4: poly(2-ethylhexyl acrylate)
E-5: poly(n-butyl acrylate)
E-6: poly(ethylene glycoldiacrylate)
E-7: poly(1,1,1,3,3,3-hexafluoroisopropyl acrylate)

Example 1-1: Preparation of Resist Underlayer Film-Forming Composition (J-1)

A mixture of (A-1) as the solvent (A1) with (A-3) as the solvent (A2) at a mass ratio of 95/5 was used as the solvent (A), and 10 parts by mass of (B-1) as the compound (B) was dissolved in 190 parts by mass of the solvent (A). The resulting solution was filtered through a membrane filter having a pore size of 0.1 μm to prepare a resist underlayer film-forming composition (J-1) of Example 1-1. The solid content concentration of the resist underlayer film-forming composition (J-1) was 5% by mass.

Examples 1-2 to 1-43 and Comparative Examples 1-1 to 1-3: Preparation of Resist Underlayer Film-Forming Compositions (J-2) to (J-43) and (j-1) to (j-3)

Each resist underlayer film-forming composition was prepared by a similar operation to that of Example 1-1 except that: a mixture of each solvent prepared at the ratio shown in the tables below (Table 1 and Table 2) was used as the solvent (A) in such an amount that the solid content concentration was as shown in the tables; and that the type and the content of each component as the components (B) to (E) were as shown in the tables below. The ratio of the solvent (A) in the tables below is presented in terms of "% by mass" in the solvent (A) in the resist underlayer film-forming composition for a semiconductor of each used solvent. It is to be noted that "-" in the tables below indicates that the corresponding component was not used.

TABLE 1

| | Resist underlayer film-forming composition | Solvent (A) (Type and Ratio) | | | | | | | | | | | | | | | |
|---|---|---|---|---|---|---|---|---|---|---|---|---|---|---|---|---|---|
| | | A-1 | A-2 | A-3 | A-4 | A-5 | A-6 | A-7 | A-8 | A-9 | A-10 | A-11 | A-12 | A-13 | A-14 | A-15 | A-16 |
| Example 1-1 | J-1 | 95 | — | 5 | — | — | — | — | — | — | — | — | — | — | — | — | — |
| Example 1-2 | J-2 | 90 | — | 10 | — | — | — | — | — | — | — | — | — | — | — | — | — |
| Example 1-3 | J-3 | 70 | 20 | 10 | — | — | — | — | — | — | — | — | — | — | — | — | — |
| Example 1-4 | J-4 | 75 | — | 25 | — | — | — | — | — | — | — | — | — | — | — | — | — |
| Example 1-5 | J-5 | 50 | — | 50 | — | — | — | — | — | — | — | — | — | — | — | — | — |
| Example 1-6 | J-6 | 95 | — | — | 5 | — | — | — | — | — | — | — | — | — | — | — | — |
| Example 1-7 | J-7 | 90 | — | — | 10 | — | — | — | — | — | — | — | — | — | — | — | — |
| Example 1-8 | J-8 | 75 | — | — | 25 | — | — | — | — | — | — | — | — | — | — | — | — |
| Example 1-9 | J-9 | 50 | — | — | 50 | — | — | — | — | — | — | — | — | — | — | — | — |
| Example 1-10 | J-10 | 90 | — | — | — | 10 | — | — | — | — | — | — | — | — | — | — | — |
| Example 1-11 | J-11 | 90 | — | — | — | — | 10 | — | — | — | — | — | — | — | — | — | — |
| Example 1-12 | J-12 | 90 | — | — | — | — | — | 10 | — | — | — | — | — | — | — | — | — |
| Example 1-13 | J-13 | 90 | — | — | — | — | — | — | 10 | — | — | — | — | — | — | — | — |
| Example 1-14 | J-14 | 90 | — | — | — | — | — | — | — | 10 | — | — | — | — | — | — | — |
| Example 1-15 | J-15 | 90 | — | — | — | — | — | — | — | — | 10 | — | — | — | — | — | — |
| Example 1-16 | J-16 | 90 | — | — | — | — | — | — | — | — | — | 10 | — | — | — | — | — |
| Example 1-17 | J-17 | 90 | — | — | — | — | — | — | — | — | — | — | 10 | — | — | — | — |
| Example 1-18 | J-18 | 90 | — | 10 | — | — | — | — | — | — | — | — | — | — | — | — | — |
| Example 1-19 | J-19 | 90 | — | 10 | — | — | — | — | — | — | — | — | — | — | — | — | — |
| Example 1-20 | J-20 | 90 | — | 10 | — | — | — | — | — | — | — | — | — | — | — | — | — |
| Example 1-21 | J-21 | 90 | — | 10 | — | — | — | — | — | — | — | — | — | — | — | — | — |
| Example 1-22 | J-22 | 90 | — | 10 | — | — | — | — | — | — | — | — | — | — | — | — | — |

| | Resist underlayer film-forming composition | Compound (B) | | Acid generating agent (C) | | Crosslinking agent (D) | | Polymeric additive (E) | | Solid content concentration (% by mass) |
|---|---|---|---|---|---|---|---|---|---|---|
| | | Type | Content (part by mass) | Type | Content (part by mass) | Type | Content (part by mass) | Type | Content (part by mass) | |
| Example 1-1 | J-1 | B-1 | 10 | — | — | — | — | — | — | 5 |
| Example 1-2 | J-2 | B-1 | 10 | — | — | — | — | — | — | 5 |
| Example 1-3 | J-3 | B-1 | 10 | — | — | — | — | — | — | 5 |
| Example 1-4 | J-4 | B-1 | 10 | — | — | — | — | — | — | 5 |
| Example 1-5 | J-5 | B-1 | 10 | — | — | — | — | — | — | 5 |
| Example 1-6 | J-6 | B-1 | 10 | — | — | — | — | — | — | 5 |
| Example 1-7 | J-7 | B-1 | 10 | — | — | — | — | — | — | 5 |
| Example 1-8 | J-8 | B-1 | 10 | — | — | — | — | — | — | 5 |
| Example 1-9 | J-9 | B-1 | 10 | — | — | — | — | — | — | 5 |
| Example 1-10 | J-10 | B-1 | 10 | — | — | — | — | — | — | 5 |

TABLE 1-continued

| | | | | | | | | | | | |
|---|---|---|---|---|---|---|---|---|---|---|---|
| Example 1-11 | J-11 | B-1 | 10 | — | — | — | — | — | — | — | 5 |
| Example 1-12 | J-12 | B-1 | 10 | — | — | — | — | — | — | — | 5 |
| Example 1-13 | J-13 | B-1 | 10 | — | — | — | — | — | — | — | 5 |
| Example 1-14 | J-14 | B-1 | 10 | — | — | — | — | — | — | — | 5 |
| Example 1-15 | J-15 | B-1 | 10 | — | — | — | — | — | — | — | 5 |
| Example 1-16 | J-16 | B-1 | 10 | — | — | — | — | — | — | — | 5 |
| Example 1-17 | J-17 | B-1 | 10 | — | — | — | — | — | — | — | 5 |
| Example 1-18 | J-18 | B-2 | 9 | C-1 | 0.2 | D-1 | 0.8 | — | — | — | 5 |
| Example 1-19 | J-19 | B-3 | 10 | — | — | — | — | — | — | — | 5 |
| Example 1-20 | J-20 | B-4 | 10 | — | — | — | — | — | — | — | 5 |
| Example 1-21 | J-21 | B-5 | 10 | — | — | — | — | — | — | — | 5 |
| Example 1-22 | J-22 | B-6 | 10 | — | — | — | — | — | — | — | 5 |

TABLE 2

| | Resist underlayer film-forming composition | Solvent (A) (Type and Ratio) | | | | | | | | | | | | | | | |
|---|---|---|---|---|---|---|---|---|---|---|---|---|---|---|---|---|---|
| | | A-1 | A-2 | A-3 | A-4 | A-5 | A-6 | A-7 | A-8 | A-9 | A-10 | A-11 | A-12 | A-13 | A-14 | A-15 | A-16 |
| Example 1-23 | J-23 | 90 | — | 10 | — | — | — | — | — | — | — | — | — | — | — | — | — |
| Example 1-24 | J-24 | 90 | — | 10 | — | — | — | — | — | — | — | — | — | — | — | — | — |
| Example 1-25 | J-25 | 90 | — | 10 | — | — | — | — | — | — | — | — | — | — | — | — | — |
| Example 1-26 | J-26 | 90 | — | 10 | — | — | — | — | — | — | — | — | — | — | — | — | — |
| Example 1-27 | J-27 | 90 | — | 10 | — | — | — | — | — | — | — | — | — | — | — | — | — |
| Example 1-28 | J-28 | 90 | — | 10 | — | — | — | — | — | — | — | — | — | — | — | — | — |
| Example 1-29 | J-29 | 90 | — | 10 | — | — | — | — | — | — | — | — | — | — | — | — | — |
| Example 1-30 | J-30 | 90 | — | 10 | — | — | — | — | — | — | — | — | — | — | — | — | — |
| Example 1-31 | J-31 | 90 | — | 10 | — | — | — | — | — | — | — | — | — | — | — | — | — |
| Example 1-32 | J-32 | 90 | — | 10 | — | — | — | — | — | — | — | — | — | — | — | — | — |
| Example 1-33 | J-33 | 90 | — | — | — | — | — | — | — | — | — | — | — | 10 | — | — | — |
| Example 1-34 | J-34 | 90 | — | — | — | — | — | — | — | — | — | — | — | — | 10 | — | — |
| Example 1-35 | J-35 | 90 | — | — | — | — | — | — | — | — | — | — | — | — | — | 10 | — |
| Example 1-36 | J-36 | 90 | — | — | — | — | — | — | — | — | — | — | — | — | — | — | 10 |
| Example 1-37 | J-37 | 90 | — | 10 | — | — | — | — | — | — | — | — | — | — | — | — | — |
| Example 1-38 | J-38 | 90 | — | 10 | — | — | — | — | — | — | — | — | — | — | — | — | — |
| Example 1-39 | J-39 | 90 | — | 10 | — | — | — | — | — | — | — | — | — | — | — | — | — |
| Example 1-40 | J-40 | 90 | — | 10 | — | — | — | — | — | — | — | — | — | — | — | — | — |
| Example 1-41 | J-41 | 90 | — | 10 | — | — | — | — | — | — | — | — | — | — | — | — | — |
| Example 1-42 | J-42 | 90 | — | 10 | — | — | — | — | — | — | — | — | — | — | — | — | — |
| Example 1-43 | J-43 | 90 | — | 10 | — | — | — | — | — | — | — | — | — | — | — | — | — |
| Comparative example 1-1 | j-1 | 100 | — | — | — | — | — | — | — | — | — | — | — | — | — | — | — |
| Comparative example 1-2 | j-2 | 100 | — | — | — | — | — | — | — | — | — | — | — | — | — | — | — |
| Comparative example 1-3 | j-3 | 100 | — | — | — | — | — | — | — | — | — | — | — | — | — | — | — |

| | Resist underlayer film-forming composition | Compound (B) | | Acid generating agent (C) | | Crosslinking agent (D) | | Polymeric additive (E) | | Solid content concentration (% by mass) |
|---|---|---|---|---|---|---|---|---|---|---|
| | | Type | Content (part by mass) | Type | Content (part by mass) | Type | Content (part by mass) | Type | Content (part by mass) | |
| Example 1-23 | J-23 | B-7 | 9 | C-1 | 0.2 | D-1 | 0.8 | — | — | 5 |
| Example 1-24 | J-24 | B-8 | 9 | C-1 | 0.2 | D-1 | 0.8 | — | — | 5 |
| Example 1-25 | J-25 | B-9 | 9 | — | — | — | — | — | — | 5 |
| Example 1-26 | J-26 | B-10 | 9 | — | — | — | — | — | — | 5 |
| Example 1-27 | J-27 | B-11 | 9 | C-1 | 0.2 | D-1 | 0.8 | — | — | 5 |
| Example 1-28 | J-28 | B-12 | 9 | C-1 | 0.2 | D-1 | 0.8 | — | — | 5 |
| Example 1-29 | J-29 | B-13 | 9 | C-1 | 0.2 | D-1 | 0.8 | — | — | 5 |
| Example 1-30 | J-30 | B-14 | 9 | C-1 | 0.2 | D-1 | 0.8 | — | — | 5 |
| Example 1-31 | J-31 | B-15 | 9 | C-1 | 0.2 | D-1 | 0.8 | — | — | 5 |
| Example 1-32 | J-32 | B-16 | 9 | C-1 | 0.2 | D-1 | 0.8 | — | — | 5 |
| Example 1-33 | J-33 | B-1 | 10 | — | — | — | — | — | — | 5 |
| Example 1-34 | J-34 | B-1 | 10 | — | — | — | — | — | — | 5 |
| Example 1-35 | J-35 | B-1 | 10 | — | — | — | — | — | — | 5 |
| Example 1-36 | J-36 | B-1 | 10 | — | — | — | — | — | — | 5 |
| Example 1-37 | J-37 | B-4 | 10 | — | — | — | — | E-1 | 1.0 | 5 |
| Example 1-38 | J-38 | B-4 | 10 | — | — | — | — | E-2 | 1.0 | 5 |
| Example 1-39 | J-39 | B-4 | 10 | — | — | — | — | E-3 | 1.0 | 5 |
| Example 1-40 | J-40 | B-4 | 10 | — | — | — | — | E-4 | 1.0 | 5 |
| Example 1-41 | J-41 | B-4 | 10 | — | — | — | — | E-5 | 1.0 | 5 |
| Example 1-42 | J-42 | B-4 | 10 | — | — | — | — | E-6 | 1.0 | 5 |
| Example 1-43 | J-43 | B-16 | 10 | — | — | — | — | E-7 | 1.0 | 5 |

TABLE 2-continued

| | | | | | | | | | | | |
|---|---|---|---|---|---|---|---|---|---|---|---|
| Comparative example 1-1 | j-1 | B-2 | 10 | — | — | — | — | — | — | — | 5 |
| Comparative example 1-2 | j-2 | B-6 | 10 | — | — | — | — | — | — | — | 5 |
| Comparative example 1-3 | j-3 | B-8 | 10 | — | — | — | — | — | — | — | 5 |

Evaluations

The obtained resist underlayer film-forming compositions (J-1) to (J-43) and (j-1) to (j-3) were evaluated on the following items according to the following methods.

Solvent Resistance

Each of the prepared resist underlayer film-forming compositions (J-1) to (J-43) and (j-1) to (j-3) was applied onto a silicon substrate by a spin coating procedure. Subsequently, the resulting substrate was heated (baked) at 250° C. for 60 sec in ambient air atmosphere to form a resist underlayer film having the average thickness of 200 nm. Thus, a substrate with a resist underlayer film having a resist underlayer film formed on a substrate was obtained (Examples 2-1 to 2-43 and Comparative Examples 2-1 to 2-3).

It is to be noted that the average thickness of the resist underlayer film was measured using a spectroscopic ellipsometer ("M2000D" available from J.A. WOOLLAM Co.).

The obtained substrate with a resist underlayer film of each of Examples 2-1 to 2-43 and Comparative Examples 2-1 to 2-3 was immersed in cyclohexanone for 1 min. The average thickness of the resist underlayer film was measured before and after the immersion. Provided that the average thickness of the resist underlayer film before the immersion is $X_0$ and the average thickness of the resist underlayer film after the immersion is X, an absolute value of a numeral value calculated by $(X-X_0) \times 100/X_0$ was obtained as a film thickness rate of change (%). The solvent resistance was evaluated as "A" (favorable) in the case of the film thickness rate of change (%) being less than 1%, "B" (somewhat favorable) in the case of the film thickness rate of change (%) being no less than 1% and less than 5%, and "C" (unfavorable) in the case of the film thickness rate of change (%) being no less than 5%. The results of the evaluations of the solvent resistance are shown in Table 3.

Embedding Properties

Each of the prepared resist underlayer film-forming compositions (J-1) to (J-43) and (j-1) to (j-3) was applied on a silicon substrate with a trench pattern having a depth of 100 nm and a groove width of 15 to 100 nm formed thereon by a spin coating procedure using a spin coater ("CLEAN TRACK ACT-12" available from Tokyo Electron Limited). The speed of rotation of spin coating was adjusted so as to be the same speed of rotation when the resist underlayer film was formed in the evaluation of the aforementioned "solvent resistance". Subsequently, the resulting substrate was heated (baked) at 250° C. for 60 sec in an ambient air atmosphere to form a resist underlayer film that coated the silicon substrate (Examples 2-1 to 2-43 and Comparative Examples 2-1 to 2-3).

The cross-sectional shape of the silicon substrate coated with the resist underlayer film of each of Examples 2-1 to 2-43 and Comparative Examples 2-1 to 2-3 was observed by using a scanning electron microscope ("S-4800" available from Hitachi High-Technologies Corporation) to evaluate the presence/absence of unfavorable embedding properties (void). The embedding properties were evaluated as "A" (favorable) in the case of unfavorable embedding properties having not been observed even when the groove width was 15 nm, and "B" (unfavorable) in the case of unfavorable embedding properties having been observed when the groove width was no less than 16 nm. The results of the evaluations of the solvent resistance are shown in Table 3.

Defects-Inhibiting Property after Etching

Each of the prepared resist underlayer film-forming compositions (J-1) to (J-43) and (j-1) to (j-3) was applied on a silicon substrate on which a thermal oxide film having the average thickness of 500 nm was formed, by a spin coating procedure. Subsequently, the resulting substrate was heated (baked) at 250° C. for 60 sec in an ambient air atmosphere to form a resist underlayer film having the average thickness of 200 nm. Thus, a substrate with a resist underlayer film having a resist underlayer film formed on the substrate was obtained (Examples 2-1 to 2-43 and Comparative Examples 2-1 to 2-3).

The obtained substrate with a resist underlayer film of each of Examples 2-1 to 2-43 and Comparative Examples 2-1 to 2-3 was subjected to a treatment by using an etching apparatus ("TACTRAS" available from Tokyo Electron Limited) with the conditions of $O_2$=400 sccm, PRESS.=25MT, HF RF=400 W, LF RF=0 W, DCS=0V, RDC=50%, and the resist underlayer film was removed. Subsequently, the resulting substrate was subjected to a treatment by using an etching apparatus ("TACTRAS" available from Tokyo Electron Limited) with the conditions of $CF_4$=180 sccm, Ar=360 sccm, PRESS.=150MT, HF RF=1,000 W, LF RF=1,000 W, DCS=−150V, RDC=50%, for 60 sec, and thus the substrate was subjected to etching. The resulting substrate was inspected by using a defect inspection apparatus ("KLA2905" available from KLA-Tencor Corporation), defect classification was carried out by using an electron-beam review apparatus ("eDR-7110" available from KLA-Tencor Corporation), and the number of convexes was calculated. The defects-inhibiting property after etching were evaluated as "A" (favorable) in the case of the number of convex defects being less than 20, and "B" (unfavorable) in the case of the number of convex defects being no less than 20.

Flatness

Each of the prepared resist underlayer film-forming compositions (J-1) to (J-43) and (j-1) to (j-3) was applied on a silicon substrate with a trench pattern having a depth of 100 nm and a groove width of 10 μm formed thereon by a spin coating procedure using a spin coater ("CLEAN TRACK ACT-12" available from Tokyo Electron Limited). The speed of rotation of spin coating was adjusted so as to be the same speed of rotation when the resist underlayer film having the average thickness of 200 nm was formed in the evaluation of the "defects-inhibiting property after etching". Subsequently, the first heating and the second heating were carried out at the heating temperatures (OC) for the to heating times (sec) shown in Table 4 below, in an ambient air atmosphere to form a resist underlayer film that coated the silicon substrate (Examples 3-1 to 3-46 and Comparative Examples 3-1 to 3-3).

The cross-sectional shape of the silicon substrate coated with the resist underlayer film of each of Examples 3-1 to 3-46 and Comparative Examples 3-1 to 3-3 was observed by using a scanning electron microscope ("S-4800" available from Hitachi High-Technologies Corporation), and the difference (AFT) between the height at the center portion of the trench pattern of the resist underlayer film and the height of a portion which was 5 μm away from the edge of the trench pattern and at which there was no trench pattern was designated as a marker of the flatness. The flatness was evaluated as "A" (extremely favorable) in the case of AFT being less than 20 nm, "B" (favorable) in the case of AFT being no less than 20 nm and less than 40 nm, and "C" (unfavorable) in the case of AFT being no less than 40 nm. The results of the evaluations of the flatness are shown in Table 4.

TABLE 3

|  | Resist underlayer film-forming composition | Solvent resistance | Embedding properties | Defects-inhibiting property after etching |
|---|---|---|---|---|
| Example 2-1 | J-1 | A | A | A |
| Example 2-2 | J-2 | A | A | A |
| Example 2-3 | J-3 | A | A | A |
| Example 2-4 | J-4 | A | A | A |
| Example 2-5 | J-5 | B | A | A |
| Example 2-6 | J-6 | A | A | A |
| Example 2-7 | J-7 | A | A | A |
| Example 2-8 | J-8 | A | A | A |
| Example 2-9 | J-9 | B | A | A |
| Example 2-10 | J-10 | A | A | A |
| Example 2-11 | J-11 | A | A | A |
| Example 2-12 | J-12 | A | A | A |
| Example 2-13 | J-13 | A | A | A |
| Example 2-14 | J-14 | A | A | A |
| Example 2-15 | J-15 | A | A | A |
| Example 2-16 | J-16 | A | A | A |
| Example 2-17 | J-17 | A | A | A |

TABLE 3-continued

|  | Resist underlayer film-forming composition | Solvent resistance | Embedding properties | Defects-inhibiting property after etching |
|---|---|---|---|---|
| Example 2-18 | J-18 | A | A | A |
| Example 2-19 | J-19 | A | A | A |
| Example 2-20 | J-20 | A | A | A |
| Example 2-21 | J-21 | A | A | A |
| Example 2-22 | J-22 | A | A | A |
| Example 2-23 | J-23 | A | A | A |
| Example 2-24 | J-24 | A | A | A |
| Example 2-25 | J-25 | A | A | A |
| Example 2-26 | J-26 | A | A | A |
| Example 2-27 | J-27 | A | A | A |
| Example 2-28 | J-28 | A | A | A |
| Example 2-29 | J-29 | A | A | A |
| Example 2-30 | J-30 | A | A | A |
| Example 2-31 | J-31 | A | A | A |
| Example 2-32 | J-32 | A | A | A |
| Example 2-33 | J-33 | A | A | A |
| Example 2-34 | J-34 | A | A | A |
| Example 2-35 | J-35 | A | A | A |
| Example 2-36 | J-36 | A | A | A |
| Example 2-37 | J-37 | A | A | A |
| Example 2-38 | J-38 | A | A | A |
| Example 2-39 | J-39 | A | A | A |
| Example 2-40 | J-40 | A | A | A |
| Example 2-41 | J-41 | A | A | A |
| Example 2-42 | J-42 | A | A | A |
| Example 2-43 | J-43 | A | A | A |
| Comparative example 2-1 | j-1 | A | A | B |
| Comparative example 2-2 | j-2 | A | A | B |
| Comparative example 2-3 | j-3 | A | A | B |

TABLE 4

|  | Resist underlayer film-forming composition | First heating | | Second heating | | Flatness |
|---|---|---|---|---|---|---|
|  |  | Heating temperature (° C.) | Heating time (sec) | Heating temperature (° C.) | Heating time (sec) |  |
| Example 3-1 | J-1 | 170 | 60 | 350 | 60 | B |
| Example 3-2 | J-2 | 170 | 60 | 350 | 60 | A |
| Example 3-3 | J-3 | 170 | 60 | 350 | 60 | A |
| Example 3-4 | J-4 | 170 | 60 | 350 | 60 | A |
| Example 3-5 | J-5 | 170 | 60 | 350 | 60 | A |
| Example 3-6 | J-6 | 170 | 60 | 350 | 60 | B |
| Example 3-7 | J-7 | 170 | 60 | 350 | 60 | A |
| Example 3-8 | J-8 | 170 | 60 | 350 | 60 | A |
| Example 3-9 | J-9 | 170 | 60 | 350 | 60 | A |
| Example 3-10 | J-10 | 170 | 60 | 350 | 60 | A |
| Example 3-11 | J-11 | 170 | 60 | 350 | 60 | A |
| Example 3-12 | J-12 | 170 | 60 | 350 | 60 | A |
| Example 3-13 | J-13 | 170 | 60 | 350 | 60 | A |
| Example 3-14 | J-14 | 170 | 60 | 350 | 60 | A |
| Example 3-15 | J-15 | 170 | 60 | 350 | 60 | A |
| Example 3-16 | J-16 | 170 | 60 | 350 | 60 | A |
| Example 3-17 | J-17 | 170 | 60 | 350 | 60 | A |
| Example 3-18 | J-18 | 170 | 60 | 350 | 60 | B |
| Example 3-19 | J-19 | 170 | 60 | 350 | 60 | A |
| Example 3-20 | J-20 | 170 | 60 | 350 | 60 | B |
| Example 3-21 | J-21 | 170 | 60 | 350 | 60 | B |
| Example 3-22 | J-22 | 170 | 60 | 350 | 60 | B |
| Example 3-23 | J-23 | 170 | 60 | 350 | 60 | A |
| Example 3-24 | J-24 | 170 | 60 | 350 | 60 | B |
| Example 3-25 | J-25 | 170 | 60 | 350 | 60 | B |
| Example 3-26 | J-26 | 170 | 60 | 350 | 60 | B |
| Example 3-27 | J-27 | 170 | 60 | 350 | 60 | B |
| Example 3-28 | J-28 | 170 | 60 | 350 | 60 | A |
| Example 3-29 | J-29 | 170 | 60 | 350 | 60 | A |
| Example 3-30 | J-30 | 170 | 60 | 350 | 60 | B |
| Example 3-31 | J-31 | 170 | 60 | 350 | 60 | B |
| Example 3-32 | J-32 | 170 | 60 | 350 | 60 | B |
| Example 3-33 | J-33 | 170 | 60 | 350 | 60 | A |
| Example 3-34 | J-34 | 170 | 60 | 350 | 60 | A |

TABLE 4-continued

|  | Resist underlayer film-forming composition | First heating | | Second heating | | |
|---|---|---|---|---|---|---|
|  |  | Heating temperature (° C.) | Heating time (sec) | Heating temperature (° C.) | Heating time (sec) | Flatness |
| Example 3-35 | J-35 | 170 | 60 | 350 | 60 | A |
| Example 3-36 | J-36 | 170 | 60 | 350 | 60 | B |
| Example 3-37 | J-37 | 170 | 60 | 350 | 60 | B |
| Example 3-38 | J-38 | 170 | 60 | 350 | 60 | B |
| Example 3-39 | J-39 | 170 | 60 | 350 | 60 | A |
| Example 3-40 | J-40 | 170 | 60 | 350 | 60 | A |
| Example 3-41 | J-41 | 170 | 60 | 350 | 60 | A |
| Example 3-42 | J-42 | 170 | 60 | 350 | 60 | A |
| Example 3-43 | J-43 | 170 | 60 | 350 | 60 | A |
| Example 3-44 | J-2 | 200 | 60 | — | — | A |
| Example 3-45 | J-2 | 150 | 60 | 350 | 60 | A |
| Example 3-46 | J-2 | 200 | 60 | 350 | 60 | A |
| Comparative example 3-1 | j-1 | 170 | 60 | 350 | 60 | C |
| Comparative example 3-2 | j-2 | 170 | 60 | 350 | 60 | C |
| Comparative example 3-3 | j-3 | 170 | 60 | 350 | 60 | C |

As is clear from the results in Table 3 and Table 4, the resist underlayer film formed from the resist underlayer film-forming composition of Examples exhibited favorable results in all of the evaluation items including flatness, the embedding properties, the defects-inhibiting property after etching, and solvent resistance. On the other hand, the resist underlayer film-forming composition of Comparative Examples is each inferior to the resist underlayer film formed from the resist underlayer film-forming composition of Examples in the evaluation items of flatness and the defects-inhibiting property after etching.

The resist underlayer film-forming composition for a semiconductor according to the embodiment of the present invention is capable of forming a resist underlayer film superior in flatness, the embedding properties, solvent resistance, and also the defects-inhibiting property after etching. The resist underlayer film according to the embodiment of the present invention is superior in flatness, the embedding properties, solvent resistance, and also the defects-inhibiting property after etching. The resist underlayer film-forming process according to the embodiment of the present invention is capable of conveniently forming a resist underlayer film superior in flatness, the embedding properties, solvent resistance, and also the defects-inhibiting property after etching. The production method of a patterned substrate according to the embodiment of the present invention is capable of obtaining a substrate having a superior pattern configuration. Therefore, these can be suitably used in production of semiconductor devices, and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A production method of a patterned substrate comprising:
    applying a resist underlayer film-forming composition on a patterned substrate to obtain a coating film on the patterned substrate;
    heating the coating film to obtain a resist underlayer film;
    forming a resist pattern on an upper face side of the resist underlayer film; and
    etching the resist underlayer film and the substrate using the resist pattern as a mask,
    the resist underlayer film-forming composition comprising:
    a solvent; and
    a compound comprising an aromatic ring,
    wherein the solvent comprises:
        a first solvent having a normal boiling point of less than 156° C., and being an alkylene glycol monoalkyl ether, an alkylene glycol monoalkyl ether acetate, or a combination thereof; and
        a second solvent having a normal boiling point of no less than 210° C. and no greater than 230° C.,
    wherein the compound comprising an aromatic ring comprises a novolak resin, a resol resin, a styrene resin, an acenaphthylene resin, an indene resin, an arylene resin, a triazine resin, a calixarene resin, a fullerene resin, or a combination thereof.

2. The production method according to claim 1, wherein a percentage content of the second solvent in the solvent is no less than 0.1% by mass and less than 60% by mass.

3. The production method according to claim 1, wherein the second solvent is an ester, an alcohol, an ether, a carbonate or a combination thereof.

4. The production method according to claim 3, wherein the ester is a carboxylic acid ester.

5. The production method according to claim 3, wherein the alcohol is a polyhydric alcohol, a polyhydric alcohol partial ether, or a combination thereof.

6. The production method according to claim 3, wherein the ether is a dialkylene glycol monoalkyl ether acetate.

7. The production method according to claim 1, wherein a value of a relative evaporation rate of the second solvent is no less than 0.01 and no greater than 10, provided that the value of butyl acetate is 100.

8. The production method according to claim 1, wherein a value of a relative evaporation rate of the second solvent is no less than 0.05 and no greater than 6, provided that the value of butyl acetate is 100.

9. The production method according to claim 1, wherein a value of a relative evaporation rate of the second solvent is no less than 0.1 and no greater than 4, provided that the value of butyl acetate is 100.

10. The production method according to claim 1, wherein a percentage content of the second solvent in the solvent is no less than 1% by mass and no greater than 50% by mass.

11. The production method according to claim 1, wherein a percentage content of the second solvent in the solvent is no less than 2% by mass and no greater than 45% by mass.

12. The production method according to claim 1, wherein a percentage content of the second solvent in the solvent is no less than 5% by mass and no greater than 40% by mass.

13. The production method according to claim 1, wherein a percentage content of the second solvent in the solvent is no less than 10% by mass and no greater than 25% by mass.

* * * * *